(12) United States Patent  (10) Patent No.: US 8,298,920 B2
Aoki  (45) Date of Patent: Oct. 30, 2012

(54) CHIP ID APPLYING METHOD SUITABLE FOR USE IN SEMICONDUCTOR INTEGRATED CIRCUIT

(75) Inventor: Shigenari Aoki, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 28 days.

(21) Appl. No.: 13/087,716

(22) Filed: Apr. 15, 2011

(65) Prior Publication Data

US 2011/0189798 A1   Aug. 4, 2011

Related U.S. Application Data

(62) Division of application No. 11/704,285, filed on Feb. 9, 2007, now Pat. No. 7,947,563.

(30) Foreign Application Priority Data

Feb. 10, 2006   (JP) ................................. 2006-033703
Jun. 26, 2006   (JP) ................................. 2006-174797

(51) Int. Cl.
*H01L 21/00* (2006.01)

(52) U.S. Cl. ................................. 438/462; 257/E23.179

(58) Field of Classification Search .................. 438/401, 438/462; 257/E23.179; 347/116
See application file for complete search history.

(56) References Cited

U.S. PATENT DOCUMENTS

| 5,451,479 A | 9/1995 | Ishibashi |
| 5,760,421 A * | 6/1998 | Takahashi et al. ..... 257/E23.179 |
| 5,798,195 A * | 8/1998 | Nishi ............................. 430/394 |
| 6,620,557 B1 | 9/2003 | Hosono et al. |
| 6,849,957 B2 | 2/2005 | Takeuchi et al. |
| 6,924,090 B2 | 8/2005 | Hirooka |
| 7,348,682 B2 | 3/2008 | Brambilia et al. |
| 7,608,932 B2 * | 10/2009 | Marinet ................ 257/E23.179 |
| 2009/0315193 A1 * | 12/2009 | Ortner ........................... 438/401 |

FOREIGN PATENT DOCUMENTS

JP   05175093   7/1993

* cited by examiner

*Primary Examiner* — Matthew Landau
*Assistant Examiner* — Sun M Kim
(74) *Attorney, Agent, or Firm* — Volentine & Whitt, PLLC (57) ABSTRACT

A chip forming position specifying method for applying chip IDs indicative of positions on a wafer where semiconductor chips are formed, and thereby specifying their positions. In the chip forming position specifying method, different marks are formed for every chip in a transfer mask (hereinafter called "mark forming mask") used to form a wiring layer, in addition to normal functional wirings. The positions of the chips on the wafer are respectively specified according to combinations of the marks of a plurality of the mark forming masks, which have been transferred onto the wafer.

8 Claims, 9 Drawing Sheets

CHIP ID APPLYING METHOD SUITABLE FOR USE IN SEMICONDUCTOR INTEGRATED CIRCUIT

CROSS-REFERENCE TO RELATED APPLICATIONS

This application is a divisional application of application Ser. No. 11/704,285 filed Feb. 9, 2007, which is hereby incorporated for all purposes. This application claims priority under 35 U.S.C. 119 from Japanese Patent Application No. JP2006-033703, and Japanese Patent Application No. JP2006-174797, the disclosures of which are incorporated by reference herein.

BACKGROUND OF THE INVENTION

The present invention relates to a chip ID applying method for specifying positions on a wafer where semiconductor chips are fabricated.

An integrated circuit is generally manufactured in accordance with the following flow.

(1) A large number of chips are fabricated on a wafer.

(2) After the formation of each circuit on the wafer, various electrical function tests are conducted in a state in which the wafer is held as it is.

The process steps (1) and (2) executed so far are generally called a pre-process or wafer process. The following process steps (3) through (5) are generally called a post-process or package process.

(3) The individual chips are separated from one another to bring them into fractionization.

(4) The fractionized chips are respectively encapsulated in plastic or a ceramic package.

(5) After encapsulation of each chip in the package, the product is completed as the integrated circuit through a final test.

The pre-process for building a large number of chips in the wafer shown in the previous process step (1) will next be explained. A technique called photolithography is normally used to build each circuit in the wafer in the pre-process. This technique is the technology of allowing circuit patterns formed in a mask (reticle) to be exposed onto the wafer using light and thereby transferring the circuit patterns. Since circuit patterns corresponding to plural chips each having the same circuit pattern are normally fabricated in a mask (e.g., 4 chips wide×4 chips deep), the circuit patterns corresponding to plural chips (e.g., 4×4=16 chips) can be transferred by one exposure (shot).

Incidentally, the circuit patterns cannot be normally transferred over the whole area of one wafer by one shot alone. Therefore, in order to transfer the circuit patterns over the whole area of the one wafer, a stage with the wafer placed thereon is moved in the horizontal and vertical directions and the shot is repeated plural times, thereby transferring the circuit patterns onto the whole surface of the wafer. This system is called "a step-and-repeat system". In the present photolithography process, only circuit patterns corresponding to one wiring layer per process step even at the maximum can be transferred. However, a complex structure or circuit having a number of wiring layers can be fabricated by repeating the photolithography process many times. In the integrated circuit manufacturing process, a few tens to a few hundreds of chips each having circuit patterns exactly identical to one another are fabricated on one wafer while the lithography process is being repeated again and again in this way.

Incidentally, if it is possible to recognize whether each individual completed integrated circuit corresponds to a chip formed at any position on the wafer, then the dependence of the degree of variations in various electrical characteristics on wafer in-plane positions, and the like can be examined. Therefore, information indicative of whether each individual chip being fabricated at any location in the wafer in-plane becomes information important in light of quality management. Since such information is of information descriptive of production histories different every chip, the information is called a chip ID in the sense that it is ID for each individual chip. The information is fabricated or built in each integrated circuit as electrically-indelible information.

Since the chips identical to one another are manufactured in large quantities at a time in the conventional integrated circuit manufacturing method as already described above, it is difficult to build the chip IDs at a pre-process stage. Therefore, the conventional method of manufacturing the semiconductor integrated circuit needed to provide an exclusive special-purpose process step within the post-process. Described specifically, IDs set for each chip are written by cutting off laser fuses or electric fuses provided inside the chips every chip.

For instance, only a first fuse is cut off when fabricated at a position A on a wafer, and first and second fuses are cut off when fabricated at a position C. This fuse cutting-off process step is normally executed as a process step accompanying the electrical function tests at the previously-mentioned process step (2). A problem arises in that since the fuse cutting-off process step needs to cut off the fuses different every chip, their cut-off must be carried out in order one chip by one chip and hence a long period of time is required.

A patent document 1 (Japanese Unexamined Patent Publication No. Hei 5 (1993)-175093) discloses a method of specifying the positions of chips in a wafer without using fuses. Here, underlaying marks for wafer-in chip position indication patterns are formed in parts of device areas of the respective chips by exposure at exposure processing in a wafer-in chip final wiring process. Thereafter, shots different in position with respect to the underlaying marks are formed by exposure and the positions of the chips in the wafer are specified by combinations of the underlaying marks and the shots.

In the method shown in the above patent document 1, however, there is a need to execute dedicated process steps in addition to the need for dedicated patterns because the transfer positions of the shots exposed onto the underlaying marks are changed in order. As a result, there is a fear that complexity of a manufacturing process and an increase in manufacturing cost are encountered.

SUMMARY OF THE INVENTION

The present invention has been made in view of the foregoing situation. It is therefore an object of the present invention to provide a method capable of specifying the positions of chips in a wafer while keeping an increase in manufacturing cost at a minimum by a simple method.

According to a first aspect of the present invention, for attaining the above object, there is provided a chip forming position specifying method for applying chip IDs indicative of positions on a wafer where semiconductor chips are formed, and thereby specifying the positions thereof, comprising the steps of forming marks different every chip in a transfer mask (hereinafter referred to as "mark forming mask") used to form a wiring layer, in addition to normal functional wirings, preparing the mark forming mask in plural form, and specifying the positions of the chips on the wafer according to combinations of the plural marks transferred onto the wafer by a plurality of the mark forming masks.

According to a second aspect of the present invention, for attaining the above object, there is provided a chip forming position specifying method for applying chip IDs indicative of positions on a wafer where semiconductor chips are formed, and thereby specifying the positions thereof, comprising the steps of forming marks different every chip in a transfer mask (hereinafter referred to as "a mark forming mask") used to form a plurality of contact holes in an insulating layer, in addition to the formation of functional patterns (contact holes or the like), preparing the mark forming mask in plural form, and specifying the positions of the chips on the wafer by combinations of the plural marks transferred onto the wafer by a plurality of the mark forming masks. In the first aspect, the ID marks are formed in the corresponding wiring layer, whereas in the second aspect, the ID marks are formed in mask patterns for an insulating film.

Preferably, the mark forming masks respectively have configurations in which a plurality of chip areas are arranged in matrix form, and linear marks are formed in the respective chip areas one by one. Among the mark forming masks, the linear marks extend in the direction to intersect one another at right angles and intersect when transferred onto the wafer, and the intersecting positions thereof are different depending on the chip forming positions on the wafer. The position of each chip on the wafer is specified based on the corresponding intersecting position.

According to a third aspect of the present invention, there is provided a chip forming position specifying method for applying chip IDs indicative of positions on a wafer, where semiconductor chips having a plurality of wiring layers are formed and thereby specifying the positions thereof, comprising the steps of forming marks different every chip in a transfer mask (hereinafter referred to as "first mark forming mask") used to form a first wiring layer of the plurality of wiring layers, in addition to normal functional wirings, forming marks different every chip in a transfer mask (hereinafter referred to as "second mark forming mask") used to form a second wiring layer of the plurality of wiring layers, formed in a layer above the first wiring layer, in addition to normal functional wirings, constructing each of the first and second mark forming masks in such a manner that a plurality of chip areas are arranged in matrix form and forming linear marks in the respective chip areas one by one, extending the linear marks in the direction to intersect one another at right angles and intersecting the linear marks when transferred onto the wafer, between the first and second mark forming masks, and allowing the intersecting positions to differ depending on the chip forming positions on the wafer, bringing the intersecting linear marks into conduction at the intersecting positions, and specifying the positions of the chips on the wafer based on conducting states of the linear marks between the first and second mark forming masks.

Here, other wiring layer having through wirings extended in a vertical direction at positions along the linear marks formed in the first and second mark forming masks is formed between the wiring layers formed using the first and second mark forming masks. The mutual marks are brought into conduction by the through wirings at the intersecting positions of the linear marks formed in the first and second mark forming masks. Currents flowing through the linear marks formed in the first mark forming mask, the through wirings and the linear marks formed in the second mark forming mask or voltages applied thereto are measured, thereby making it possible to specify the forming positions of the chips on the wafer.

In the present invention as described above, chip ID marks can be transferred using a normal device forming mask. There is no need to prepare a special mask for chip Ds or add a special process step. As a result, an increase in manufacturing cost with the fabrication of the chip IDs can be kept to the minimum.

Further, according to a method of specifying the position on a wafer, of each completed semiconductor chip, based on electrical conducting states of marks formed in one wiring layer and marks formed in other wiring layer, it is possible to automatically detect its position without depending on a visual examination using an electron microscope or the like and thereby perform a rationalization of a function test on each semiconductor chip. Furthermore, there is a merit that chip IDs can be confirmed without taking the semiconductor chip from the corresponding mold package.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
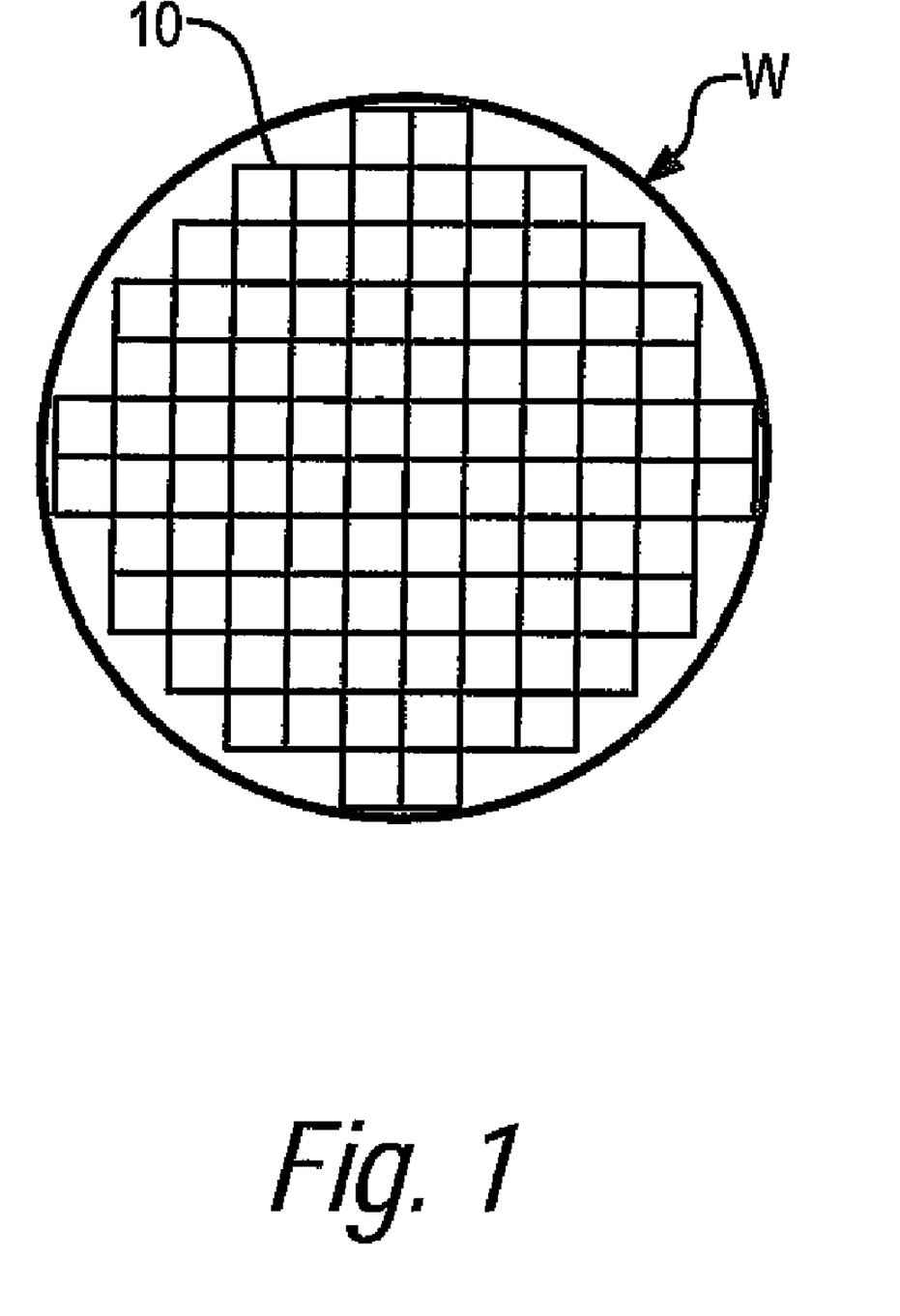
FIG. 1 is a schematic plan view showing a structure of a wafer applicable to the present invention.

The present invention will hereinafter be described in detail by preferred embodiments. FIG. 1 is a schematic plan view showing a structure of a wafer applicable to the present invention. A large number of semiconductor chips 10 identical to one another in structure are formed on the wafer W. Each of the semiconductor chips 10 can be brought into a structure having a plurality of laminated wiring layers.

First Preferred Embodiment

Figure 2A:
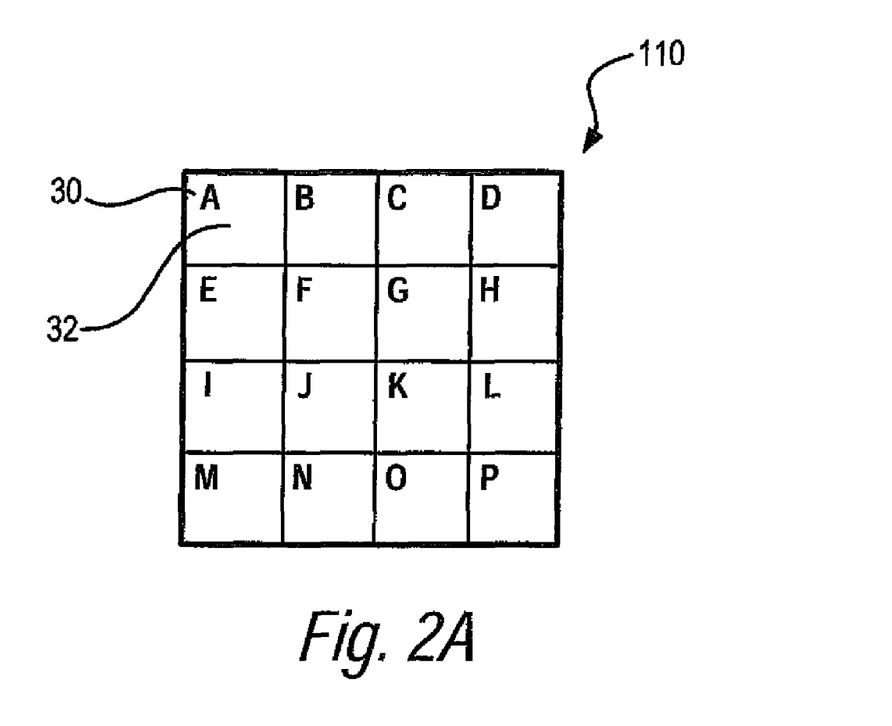
FIG. 2(A) and 2(B) are—plan view illustrating mask patterns applicable to a method according to a first embodiment of the present invention.

FIG. 2 is a plan view showing mask patterns applicable to a method according to a first embodiment of the present invention. In a semiconductor device manufacturing method according to the present embodiment, circuit patterns are transferred onto the entire surface of the wafer W using a mask 110 having a configuration shown in FIG. 2(A) upon a photolithography process for one wiring layer. In the present example, nine shots are made per wafer using a mask (reticle) which enables transfer corresponding to 4×4=16 chips per shot.

The mask 110 comprises 16 chip areas each having the same functional wiring (device forming wiring), which are disposed in matrix form. The respective chip areas are respectively formed with marks different from one another. For example, mark A denoted by reference numeral 30 is shown in the chip area in the upper left corner of mask 110. Although the upper-case alphabetic characters A-P are adopted as the marks in the present embodiment, characters or symbols other than the alphabet can also be used. If such a position and size as not to influence the function wiring are taken as the position and size of each mark, then each of the marks may not be placed at the end of the chip area. In FIG. 2(A), wirings (functional wirings) related to the functions of the semiconductor chips are in each of the chip areas. For example, wiring in chip area A in the upper left corner of mask 10 is generally denoted by reference numeral 32. It should be understood that the same wiring as in chip area A is also disposed in each of the chip areas having markings B-P. It should also be understood that any wiring configuration as would be desired by the designer can be used as the functional wirings.

Figure 2B:
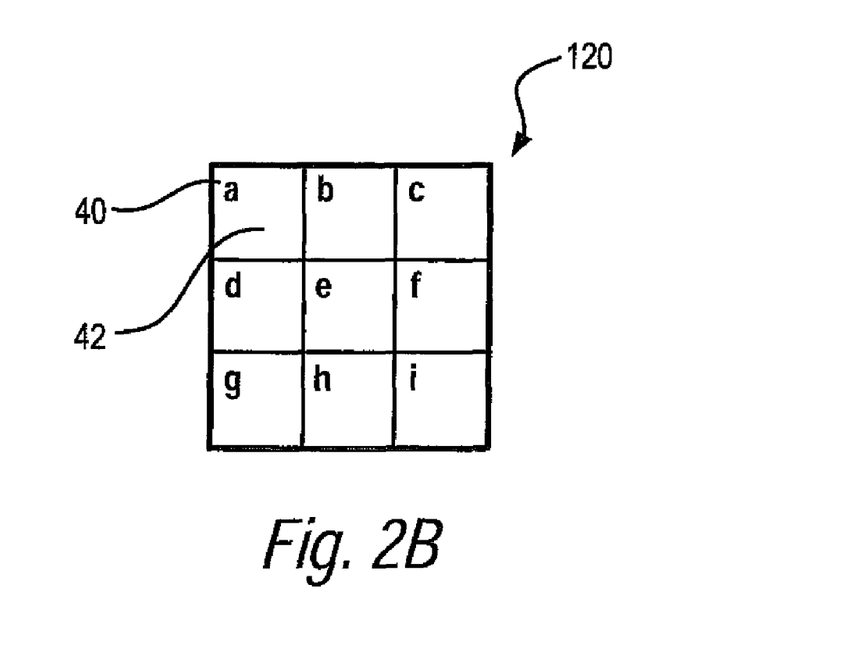

A mask pattern 120 shown in FIG. 2(B) is used upon forming a wiring layer different from one for the mask pattern 110 shown in FIG. 2(A). For example, a wiring layer using the mask pattern 120 can be formed in a layer above a wiring layer using the mask pattern 110 through an insulating layer interposed therebetween. In a manner similar to the mask pattern 110, circuit patterns are transferred onto the whole surface of the wafer by a lithography process. In FIG. 2(B), wirings (functional wirings) related to the functions of the semiconductor chips are in chip areas a-i, wherein for example mark a denoted by reference numeral 40 is shown in the chip area in the upper left corner of mask 120. The wiring in chip area a is generally denoted by reference numeral 42. It should be understood that the same wiring as in chip area a is also disposed in each of the chip areas having markings b-i.

It should also be understood that any wiring configuration as would be desired by the designer can be used as the functional wirings.

In the present example, sixteen shots are made per wafer using a mask that enables transfer corresponding to 3×3=9 chips per shot. The mask 120 comprises nine chip areas each having the same functional wiring, which are disposed in matrix form. The respective chip areas are respectively formed with marks different from one another. Although the lower-case alphabetic characters a-i are adopted as the marks in the present embodiment, characters or symbols other than the alphabet can also be used. If such a position and size as not to influence the function wiring are taken as the position and size of each mark, then each of the marks may not be placed at the end of the chip area. Even in FIG. 2(B), wirings (functional wirings) related to the functions of the semiconductor chips are not shown in the figures for convenience.

Figure 3:
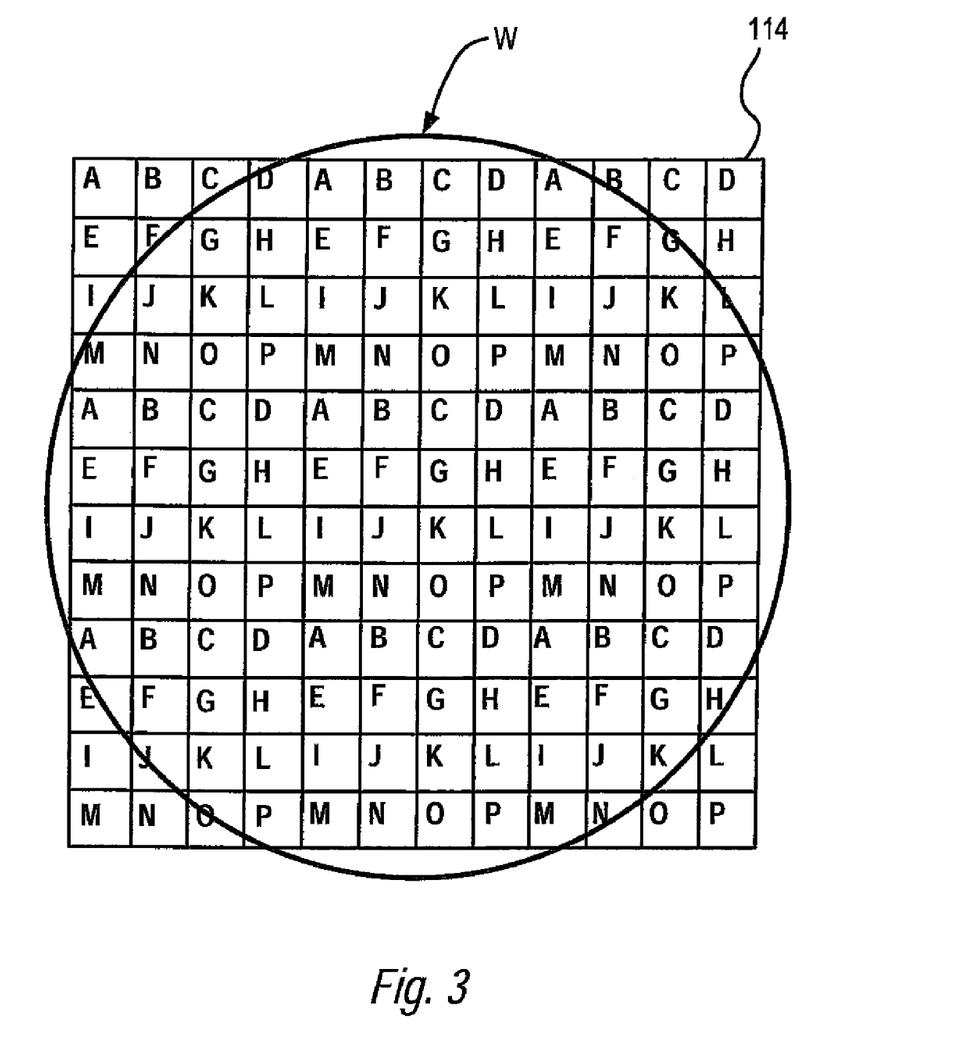
FIG. 3 is an explanatory view showing a position process employed in the method according to the first embodiment.
Figure 4:
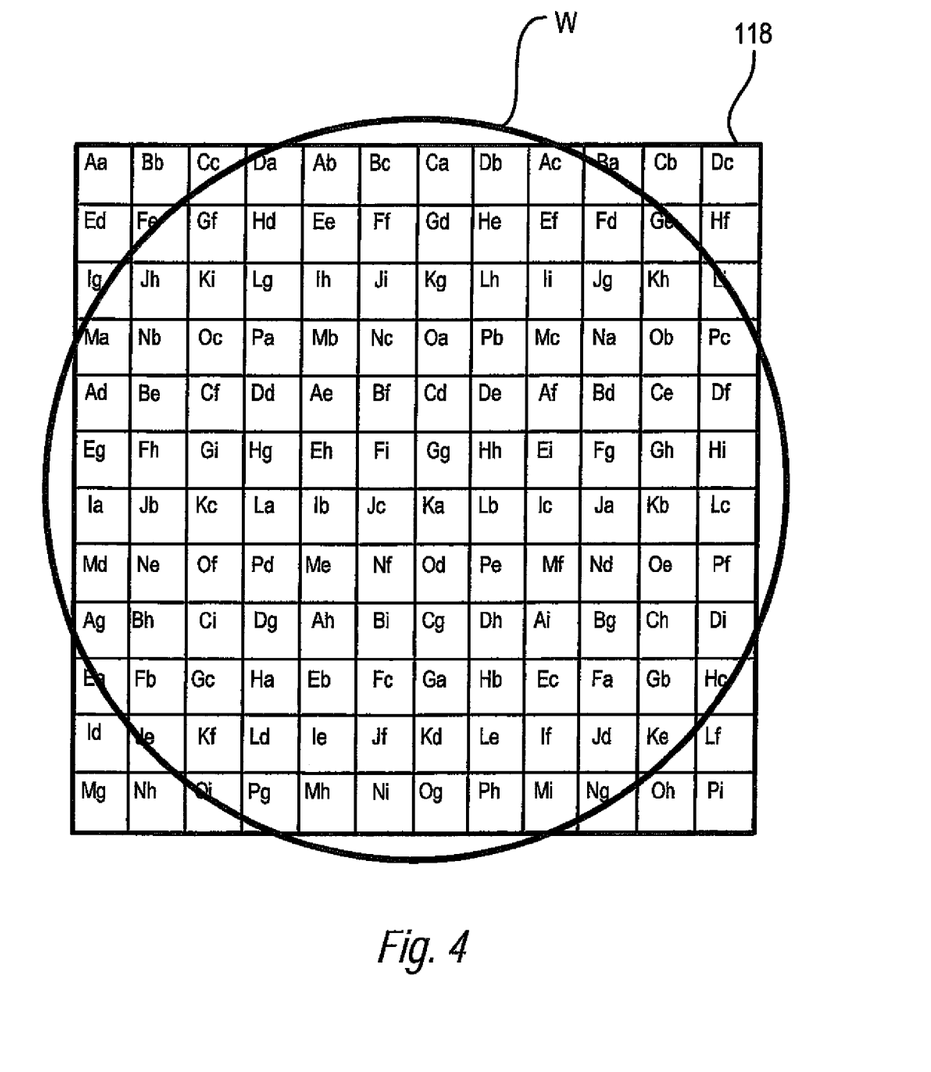
FIG. 4 is an explanatory view depicting a position process employed in the method according to the first embodiment.

FIG. 3 shows, as a first wiring layer pattern 114, the manner in which marks are actually transferred onto a wafer W using the mask pattern 110. FIG. 4 shows a second wiring layer pattern 118 formed by transferring marks onto the first wiring layer pattern 114 using the mask pattern 120. In the manufacturing method of the present embodiment, it is possible to recognize, by confirmation of the mark formed in each chip, at which position on the wafer W each individual chip is fabricated. It is understood in this example that, for instance, when the mark called "G" is confirmed at the first wiring layer pattern 114 and the mark called "g" is further configured at the second wiring layer pattern 118, the corresponding semiconductor chip is a chip formed in the center of the wafer W.

In the present embodiment, each mask capable of exposing 16 chips=4 columns deep×4 rows wide at a time is used in the first wiring layer, and each mask capable of exposing 9 chips=3 columns deep×3 rows wide at a time is used in the second wiring layer. It is therefore possible to distinguish up to 144 chips=12 columns deep×12 rows wide at the maximum from one another. The figure of "12" at this calculation is called the least common denominator between the values of 4 columns (rows) deep (or wide) in the mask 110 having the first wiring layer and the values of 3 columns (rows) deep (or wide) in the mask 120 having the second wiring layer. Assuming that a mask capable of exposing $Y_1X_1$ chips=$Y_1$ columns deep×$X_1$ rows wide at a time is used in the first wiring layer, and a mask capable of exposing $Y_2X_2$ chips=$Y_2$ columns deep×$X_2$ rows wide at a time is used in the second wiring layer, it is possible to distinguish up to (the least common denominator of $Y_1$ and $Y_2$)×(the least common denominator of $X_1$ and $X_2$) chips at the maximum from one another.

Further, if a mask capable of exposing $Y_3X_3$ chips=$Y_3$ columns deep×$X_3$ rows wide at a time is used in a third wiring layer, then the distinguishable number of chips can be increased up to (the least common denominator of $Y_1$, $Y_2$ and $Y_3$)×(the least common denominator of $X_1$, $X_2$ and $X_3$) chips at the maximum. In the method according to the present embodiment, each of the mark 110 of the first wiring layer and the mark 120 of the second wiring layer both transferred within a wafer process or a pre-process acts as a chip ID. That is, it is possible to specify the position on the wafer, of each manufactured semiconductor chip by a combination of the mark formed in the mask pattern 110 and the mark formed in the mask pattern 120. Therefore, there is no need to provide a time-consuming fuse cutting-off process within a post-process or a package process as in the prior art.

Incidentally, although the two types (110 and 120) have been used as the mask patterns for forming the ID marks in the first embodiment referred to above, three or more types (three or more layers) can also be used. Although not restricted in particular, the positions of the layers for forming the mask 110 and 120 may preferably be formed in the layers located on the upper side (including the top layer) to confirm the same visually (by an electron microscope) later.

Figure 9:
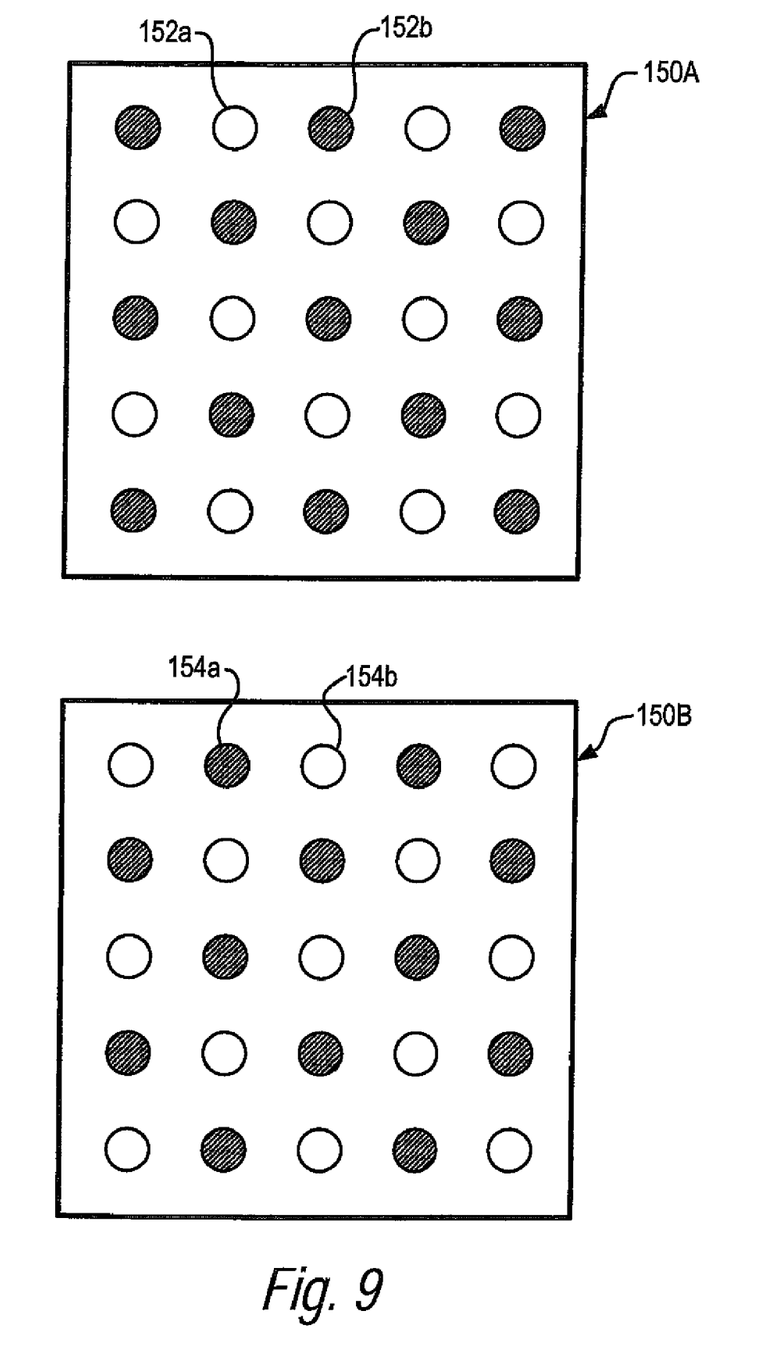
FIG. 9 is a plan view depicting insulating film mask patterns employed in another form of the method according to the first embodiment.

FIG. 9 is a plan view showing mask patterns for insulating films, which are employed in another form (modification) of the method according to the first embodiment. While the ID marks are formed in the wiring layer in the first embodiment, ID marks can be formed in such mask patterns as shown in FIG. 9. As the used ID marks, such ones as shown in FIGS. 2 through 4 can be adopted. In the example shown in FIG. 9, a plurality of contact holes are formed or defined in a single insulating layer using two sheets of masks 150A and 150B. A pattern 152b of the mask 150A and a pattern 154a of the mask 150B are associated with their corresponding contact hole forming positions. A pattern 162a of the mask 150A and a pattern 154b of the mask 150B do not contribute to the formation of the contact holes. In the example shown in FIG. 9, the mask 150A is used at the first exposure and the mask 150B is used at the subsequent second exposure. That is, one-half the contact holes are formed (exposed) using the mask 150A and the remaining one-half the contact holes are formed (exposed) using the mask 150B.

Even in the case in which the ID marks are formed in the wiring layer, a plurality of sheets of masks are provided and the ID marks can also be formed in a single wiring layer. In this case, the ID marks can be formed by a procedure similar to one for the insulating layer shown in FIG. 9.

Incidentally, since the formation of the ID marks in the wiring layer is superior in visibility to the formation of the ID marks in the insulating layer, it is preferable to form them in the wiring layer practically.

In an actual wafer process, functional wirings (devices) and alphabetic marks are formed in respective chip areas constituting a mask pattern 10 in advance. For example, pattern drawing is effected on a transparent glass substrate using a metal such as chromium. A mask pattern 120 is formed with functional wirings and alphabetic marks (lower-case characters) by a similar method. Such patterns as shown in FIG. 3 are first transferred onto the wafer W using the mask pattern 110 by means of step-and-repeat executed by a scale-down projection exposure device (stepper). Thereafter, such patterns as shown in FIG. 4 are transferred onto the wafer W using the mask pattern 120 by a similar method.

Thereafter, the individual semiconductor chips are brought to completion through the known processes. Next, the fractionalized semiconductor chips are encapsulated or sealed in plastic or ceramic packages. They are completed as integrated circuits via a final test. A quality test is effected on the completed semiconductor integrated circuits. The failure- or defect-detected semiconductor integrated circuits are visually observed by, for example, an optical microscope, so that it is discriminated at which positions on the wafer they are formed. Incidentally, when each chip ID is actually confirmed, the corresponding semiconductor chip is taken out from the mold package to confirm it. Alternatively, it is confirmed before each semiconductor chip is encapsulated in the mold package.

Second Preferred Embodiment

Figure 5A:
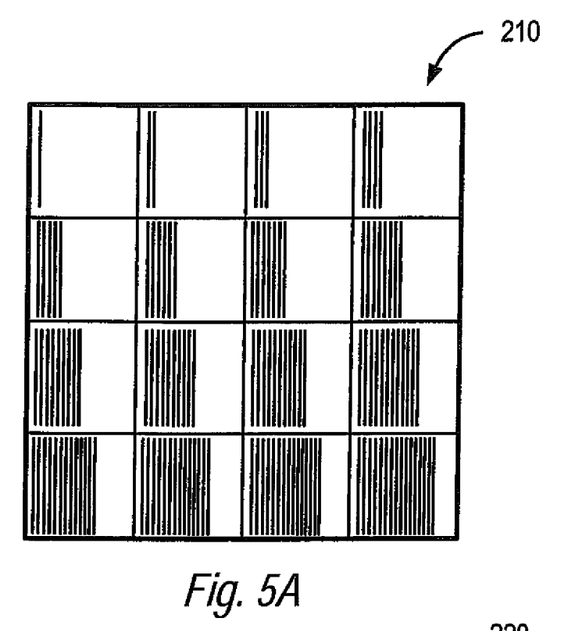
FIG. 5(A), 5(B), and 5(C) are—plan view showing mask patterns applicable to a method according to a second embodiment of the present invention.
Figure 5B:
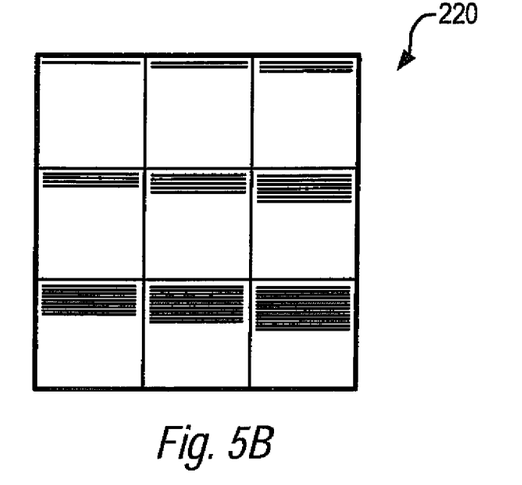

FIG. 5 is a plan view showing mask patterns (210 and 220) applicable to a method according to a second embodiment of the present invention. Basically, the difference between the present embodiment and the first embodiment resides in the shape of a mark constituting each chip ID. According to the mask patterns 210 and 220 employed in the present embodiment, there is a merit that their marks are superior in visibility to the alphabetic marks (character marks) shown in the first embodiment. In the second embodiment, the mask pattern 210 having line-like marks extending in the vertical direction, and the mask pattern 220 having line-like marks extending in the horizontal direction are used.

Figure 5C:
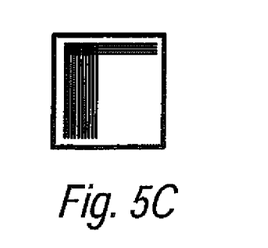

The line-shaped marks different in the number of lines are respectively formed in chip areas of the mask pattern 120. Similarly, the line-like marks different in the number of lines are respectively formed in chip areas of the mask pattern 220. The position on a wafer W, of each semiconductor chip is specified by a combination of the two mask patterns 210 and 220. FIG. 5(C) shows the manner in which they are combined together (superimposed on each other).

In a method of manufacturing a semiconductor device, according to the present embodiment, circuit patterns are transferred onto the entire surface of the wafer W using such a mask 210 as shown in FIG. 5(A) upon a photolithography process for one wiring layer. In the present example, nine shots are done per wafer using a mask (reticle) which enables transfer corresponding to 4×4=16 chips per shot. The mask 210 comprises 16 chip areas each having the same functional wiring (device), which are disposed in matrix form. If such a position and shape as not to influence the function wiring (device) are taken, then the position, width, length and the like of each mark may not be placed at the end of each chip area. In FIG. 5(A), wirings (functional wirings) related to the functions of the semiconductor chips are not shown for convenience.

The mask pattern 220 shown in FIG. 5(B) is used upon forming a wiring layer different from that for the mask pattern 210 shown in FIG. 5(A). For example, a wiring layer using the mask pattern 220 can be formed in a layer above a wiring layer using the mask pattern 210 through an insulating layer interposed therebetween. In a manner similar to the mask pattern 210, circuit patterns are transferred onto the whole surface of the wafer by a lithography process. In the present example, sixteen shots are done per wafer using a mask that enables transfer corresponding to 3×3=9 chips per shot. The mask 220 comprises nine chip areas each having the same functional wiring, which are disposed in matrix form. In a manner similar to the mask pattern 210, the position, width, length and the like of each mark may not be placed at the end of each chip area if such a position and shape as not to influence the functional wiring (device) are taken. Even in FIG. 5(B), wirings (functional wirings) related to the functions of the semiconductor chips are not illustrated for convenience.

According to the present embodiment, it is easy to recognize each mark even where the two marks overlap each other, as compared with the first embodiment. Therefore, the mask patterns 210 and 220 can be designed in such a manner that the two marks overlap each other. It is further possible to reduce space for forming each chip ID mark to the minimum.

Third Preferred Embodiment

Figure 6A:
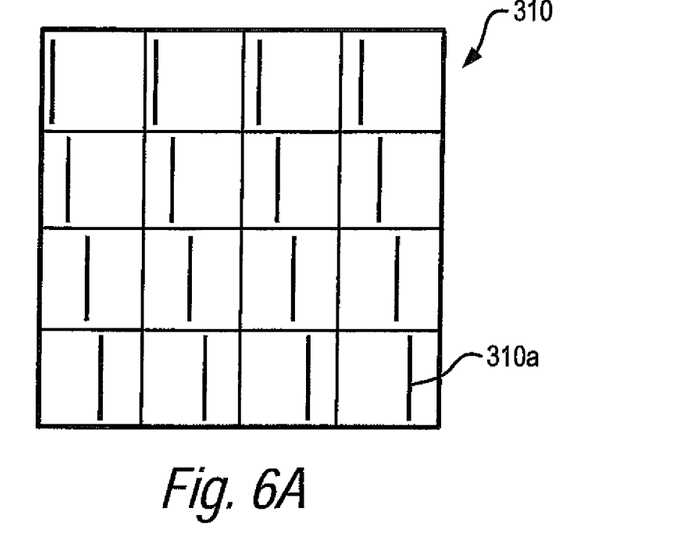
FIG. 6(A), 6(B), and 6(C) are—plan view illustrating mask patterns applicable to a method according to a third embodiment of the present invention.
Figure 6B:
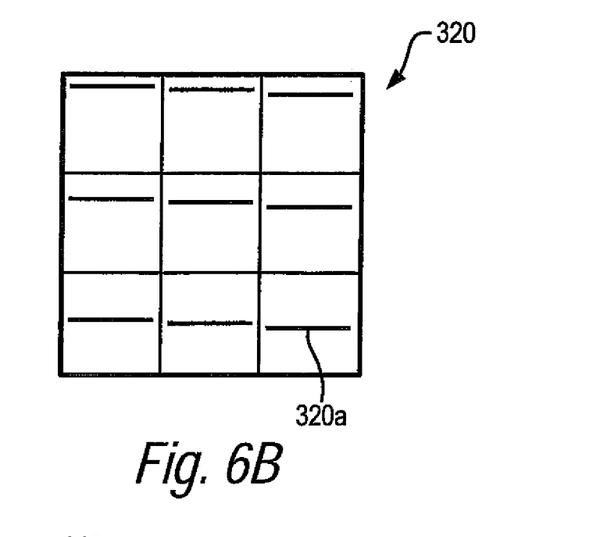
Figure 6C:
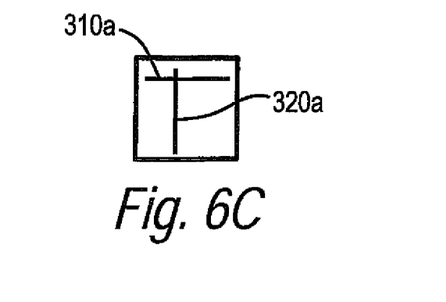

FIG. 6 is a plan view showing mask patterns 310 and 320 applicable to a method according to a third embodiment of the present invention. The present embodiment is different from the first and second embodiments in terms of the shape of each mark constituting a chip ID. In the present embodiment, although explained in detail later, chip ID marks 310*a* and 320*a* are electrically detected without depending on a visual inspection. In the present embodiment, the mask pattern 310 having respective one line-like marks extending in the vertical direction every chip area, and the mask pattern 320 having respective one line-like marks extending in the horizontal direction every chip area are used. The position on a wafer W, of each semiconductor chip is specified by a combination of the two mask patterns 310 and 320. FIG. 6(C) shows the manner in which they are combined together (superimposed on each other).

In a method of manufacturing a semiconductor device, according to the present embodiment, circuit patterns are transferred onto the entire surface of the wafer W using such a mask 310 as shown in FIG. 6(A) upon a photolithography process for one wiring layer. In the present example, nine shots are made per wafer using a mask (reticle) which enables transfer corresponding to 4×4=16 chips per shot. The mask 310 comprises 16 chip areas each having the same functional wiring (device), which are disposed in matrix form. If such a position and shape as not to influence the function wiring (device) are taken, then the position, width, length and the like of each mark may not be placed at the end of each chip area. In FIG. 6(A), wirings (functional wirings) related to the functions of the semiconductor chips are not illustrated for convenience.

The mask pattern 320 shown in FIG. 6(B) is used upon forming a wiring layer different from that for the mask pattern 310 shown in FIG. 6(A). For example, a wiring layer using the mask pattern 320 can be formed in a layer above a wiring layer using the mask pattern 310 through an insulating layer interposed therebetween. In a manner similar to the mask pattern 310, circuit patterns are transferred onto the whole surface of the wafer by a lithography process. In the present example, sixteen shots are made per wafer using a mask that enables transfer corresponding to 3×3=9 chips per shot. The mask 320 comprises nine chip areas each having the same functional wiring, which are disposed in matrix form. In a manner similar to the mask pattern 310, the position, width, length and the like of each mark may not be placed at the end of each chip area if such a position and shape as not to influence the functional wiring (device) are taken. Even in FIG. 6(B), wirings (functional wirings) related to the functions of the semiconductor chips are not shown for convenience.

Figure 7A:
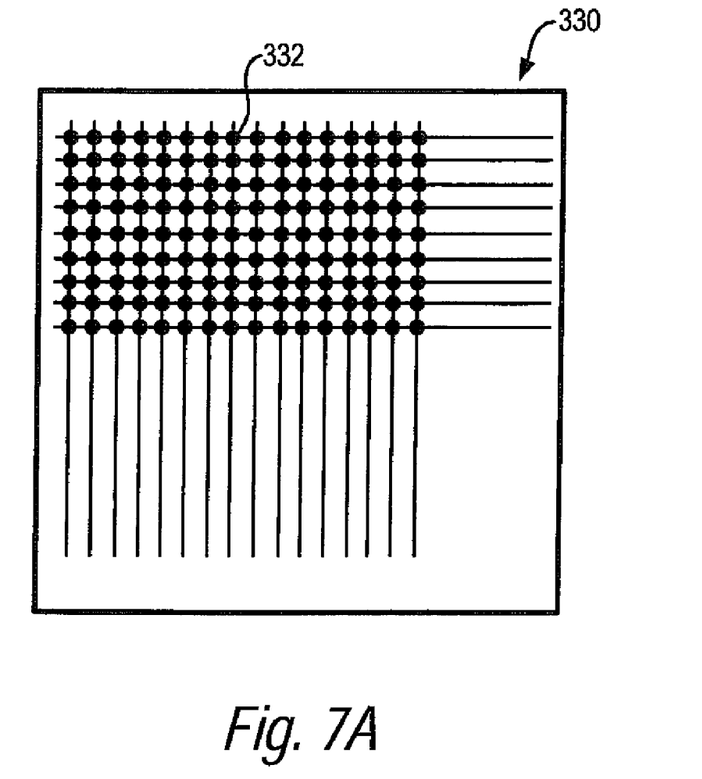
FIG. 7(A) is a plan view showing a mask pattern applicable to the method according to the third embodiment.
Figure 7B:
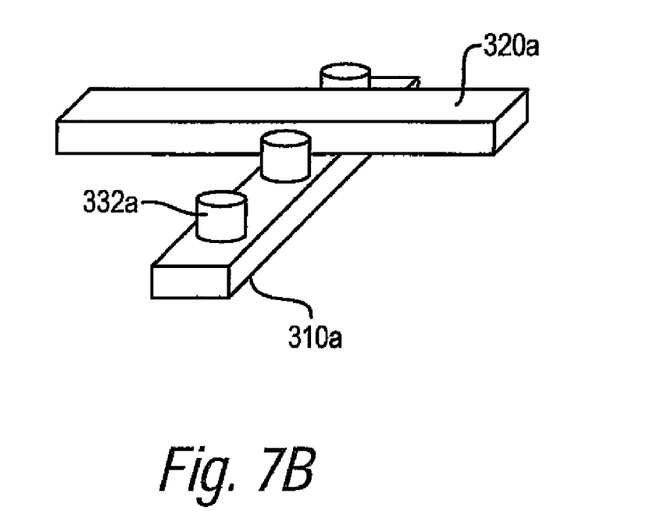
FIG. 7(B) is an enlarged explanatory view showing part of a pattern formed by the method according to the third embodiment.

FIG. 7(A) is a plan view showing a mask pattern 330 applicable to the method according to the third embodiment. FIG. 7(B) is an enlarged explanatory view showing part of a pattern formed by the method according to the third embodiment. The mask pattern 330 is used upon forming a wiring layer between the wiring layer using the mask pattern 310 shown in FIG. 6(A) and the wiring layer using the mask pattern 320 shown in FIG. 6(B). The mask pattern 330 has dot patterns 332 laid out and formed in matrix form at intervals each corresponding to the pitch (the amount of deviation between chip areas) between the line-like marks formed in the mask patterns 310 and 320. The dot patterns 332 are respectively formed at positions each corresponding to an intersection point of the line-like marks 310a and 320a.

The dot patterns 332 may be formed at the positions corresponding to the line-like marks 310a and 320a. Thus, there is no need to form the dot patterns over the entire chip area. The mask pattern 330 can be formed in the same mask as one for functional wirings if such a position and shape as not to influence the functional wirings (devices) are taken. Alternatively, a dedicated mask can also be used. The mask pattern 330 can be constituted of an arrangement of 4×4 set in a manner similar to the mask pattern 310, or an arrangement of 3×3 set in a manner similar to the mask pattern 320.

As shown in FIG. 7(B), each of columnar through wirings 332a is formed by the dot pattern 332 to enable an electrical connection between the line-like marks 310a and 320a.

Figure 8:
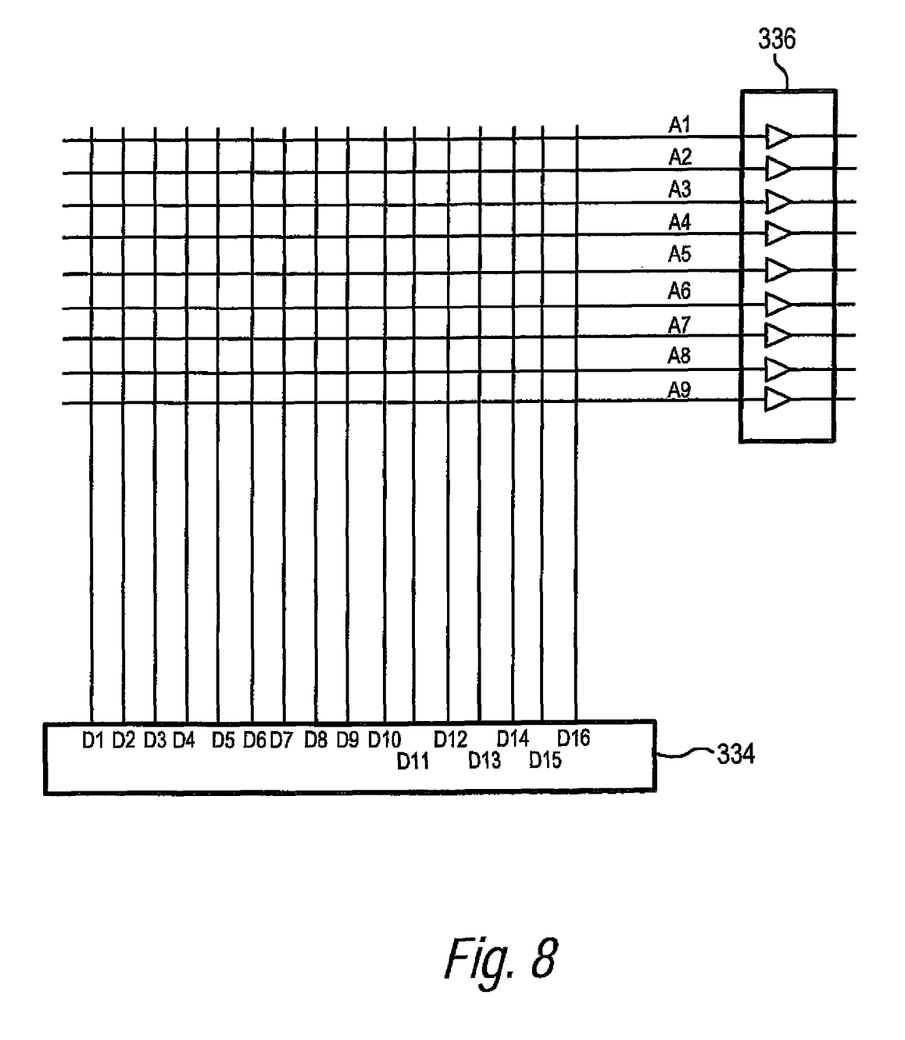
FIG. 8 is a circuit diagram illustrating a circuit configuration applicable to the method according to the third embodiment.

FIG. 8 is a circuit diagram showing a configuration of a chip ID detecting circuit applicable to the method according to the third embodiment. Output terminals D1 through D16 of a chip ID decoder 334 are connected to their corresponding wirings formed by the line-like marks 310a formed in the mask pattern 310. Input terminals A1 through A9 of a chip ID detecting amplifier 336 are connected to their corresponding wirings formed by the line-like marks 320a formed in the mask pattern 320. The chip ID detecting wirings formed by the mask pattern 310 are different from one another in position where they are fabricated depending on which chips of positions on the mask correspond as shown in FIG. 6(A). As a result, the connected output terminals D1 through D16 of chip ID decoder 334 are manufactured so as to differ depending on which chips of positions on the mask. In the case of, for example, the chip at the upper left corner of the mask pattern 310 shown in FIG. 6(A), the connected output terminal of chip ID detecting decoder 334 becomes M. In the case of the chip adjoining to one right side of the uppermost left of the mask pattern 310, the connected output terminal of chip ID detecting decoder 334 results in D2.

The chip ID detecting wirings formed by the mask pattern 320 are different from one another in position where they are fabricated depending on which chips of positions on the mask correspond as shown in FIG. 6(B). As a result, the connected input terminals A1 through A9 of chip ID detecting amplifier 336 are manufactured so as to differ depending on which chips of positions on the mask. In the case of, for example, the chip at the upper left corner of the mask pattern 320 shown in FIG. 6(B), the connected input terminal of chip ID detecting amplifier 336 becomes A1. In the case of the chip adjoining to one right side of the uppermost left of the mask pattern 320, the connected input terminal of chip ID detecting amplifier 336 results in A2.

Operations of the circuit shown in FIG. 8 will next be explained. Of the plural outputs of the chip ID decoder 334, D1 is first operated. For example, the voltage at the output D1 is raised to 3V. Next, the chip ID detecting amplifier 336 is operated to confirm from which amplifier at the terminals A1 through A9 a signal is outputted. For instance, confirmation is made whether a voltage of 3V has been detected. Next, after completion of confirmation at the wiring D1 connected to the decoder 334, the output of the decoder 334 is changed from D2 to D16 subsequently in like manner and thereafter the above operations are repeated.

For example, the chip ID detecting wirings (D1 through D16 and A1 through A9) respectively indicate the following behaviors at an integrated circuit having such a chip ID that the output terminal D8 of the chip ID decoder 334 and the input terminal A3 of the chip ID detecting amplifier 336 are connected to each other.

When any of the outputs D1 through D7 and D9 through D16 of the decoder 334 in the chip ID detecting circuit is operated (increased in voltage), no signal is outputted from any amplifier from A1 through A9 of the chip ID detecting amplifier 336.

When the output D8 of the decoder 334 in the chip ID detecting circuit is operated, a signal is outputted only from A3 of the chip ID detecting amplifier 336.

Thus, if confirmation is made as to from which amplifier (A1 through A9) the signal is outputted, when any decoder output (D1 through D16) is operated, it is then possible to recognize which chip ID is contained in a target integrated circuit.

In general, the semiconductor integrated circuit is placed in a state in which each semiconductor chip is encapsulated in a mold package. Thus, in order to confirm each chip ID in the first and second embodiments, the semiconductor chip is taken out from within the mold package and should be then observed. On the other hand, if the present embodiment is used, then the corresponding chip ID can be electrically confirmed without the need to take the semiconductor chip out of the mold package.

While the preferred forms of the present invention have been described, it is to be understood that modifications will be apparent to those skilled in the art without departing from the spirit of the invention. The scope of the invention is to be determined solely by the following claims.

What is claimed is:

1. A chip forming position specifying method for applying chip identifications indicative of position of semiconductor chips on a wafer, the semiconductor chips having a plurality of wiring layers, the method comprising:

forming different first linear marks for every semiconductor chip in a first transfer mask used to form a first wiring layer and normal functional wirings of the plurality of wiring layers;

forming different second linear marks for every semiconductor chip in a second transfer mask used to form a second wiring layer and normal functional wirings of the plurality of wiring layers, the second wiring layer above the first wiring layer;

constructing each of the first and second transfer masks so that a plurality of chip areas are arranged in matrix form and so that the first and second linear marks are formed in the respective chip areas one by one, the first and second linear marks extend in directions to intersect one another at right angles when transferred onto the wafer from the first and second transfer masks, so that the intersecting positions differ depending on chip forming positions on the wafer;

bringing the intersecting first and second linear marks into conduction at the intersecting positions; and specifying positions of the chips on the wafer based on conducting states of the first and second linear marks.

2. The chip forming position specifying method according to claim 1, further comprising:

forming another wiring layer having through wirings extending between the first and second wiring layers at positions along the first and second linear marks formed in the first and second transfer masks, the another wiring layer disposed between the first and second wiring layers formed using the first and second transfer masks;

bringing corresponding intersecting first and second linear marks into conduction by the through wirings at the intersecting positions; and measuring currents flowing through the first linear marks formed in the transfer mask, the through wirings and the second linear marks formed in the second transfer mask, to thereby specify the positions of the chips on the wafer.

3. The chip forming position specifying method according to claim 2, wherein said measuring currents comprises:

connecting output terminals of a chip decoder to corresponding wirings formed by the first linear marks, and applying voltages from the chip decoder to the output terminals sequentially one at a time; and connecting a chip detecting amplifier to corresponding wirings formed by the second linear marks, and measuring the currents flowing through the second linear marks responsive to the applied voltages using the chip detecting amplifier.

4. The chip forming position specifying method according to claim 2, wherein the another wiring layer comprises a plurality of the through wirings formed in an matrix.

5. The chip forming position specifying method according to claim 1, wherein the first transfer mask is a first matrix of chip areas including a first number of different first linear marks, and the second transfer mask is a second matrix of chip areas including a second number of different second linear marks.

6. The chip forming position specifying method according to claim 5, wherein the first matrix is a 4 by 4 matrix including 16 different first linear marks, and the second matrix is a 3 by 3 matrix including 9 different second linear marks.

7. The chip forming position specifying method according to claim 1, wherein the first and second linear marks are respective one-line marks.

8. The chip forming position specifying method according to claim 1, wherein the first linear marks extend in a vertical direction and the second linear marks extend in a horizontal direction.

* * * * *